(12) United States Patent
Tian et al.

(10) Patent No.: US 9,837,502 B2
(45) Date of Patent: Dec. 5, 2017

(54) CONDUCTIVE STRUCTURE AND MANUFACTURING METHOD THEREOF, ARRAY SUBSTRATE, DISPLAY DEVICE

(71) Applicant: BOE Technology Group Co., Ltd., Beijing (CN)

(72) Inventors: Hongwei Tian, Beijing (CN); Kaihong Ma, Beijing (CN); Wenqing Xu, Beijing (CN); Yueping Zuo, Beijing (CN); Xiaowei Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/907,778

(22) PCT Filed: Aug. 24, 2015

(86) PCT No.: PCT/CN2015/087879
§ 371 (c)(1),
(2) Date: Jan. 26, 2016

(87) PCT Pub. No.: WO2016/155214
PCT Pub. Date: Oct. 6, 2016

(65) Prior Publication Data
US 2017/0040430 A1    Feb. 9, 2017

(30) Foreign Application Priority Data

Apr. 3, 2015   (CN) .......................... 2015 1 0158811

(51) Int. Cl.
*H01L 29/423* (2006.01)
*H01L 23/50* (2006.01)
(Continued)

(52) U.S. Cl.
CPC .. *H01L 29/42384* (2013.01); *H01L 21/28008* (2013.01); *H01L 23/50* (2013.01);
(Continued)

(58) Field of Classification Search
None
See application file for complete search history.

(56) References Cited

U.S. PATENT DOCUMENTS

| 6,620,527 | B2 * | 9/2003 | Wang ..................... B32B 15/02 204/192.11 |
| 2006/0076562 | A1 * | 4/2006 | Lee ......................... H01L 29/12 257/72 |

(Continued)

FOREIGN PATENT DOCUMENTS

| CN | 1716637 A | 1/2006 |
| CN | 101226964 A | 7/2008 |

(Continued)

OTHER PUBLICATIONS

Dec. 14, 2015—(WO)—International Search Report and Written Opinion Appn PCT/CN2015/087879 with English Tran.

(Continued)

*Primary Examiner* — Cuong Q Nguyen
*Assistant Examiner* — Nishath Yasmeen
(74) *Attorney, Agent, or Firm* — Banner & Witcoff, Ltd.

(57) ABSTRACT

A conductive structure and a manufacturing method thereof, an array substrate and a display device. The conductive structure includes a plurality of first metal layers made of aluminum, and between every two first metal layers that are adjacent, there is also provided a second metal layer, which is made of a metal other than aluminum. With the conductive structure, the hillock phenomenon that happens to the conductive structure when it is heated can be decreased without reducing the overall thickness of the conductive structure.

14 Claims, 2 Drawing Sheets

(51) Int. Cl.
*H01L 29/41* (2006.01)
*H01L 21/28* (2006.01)
*H01L 27/12* (2006.01)
*H01L 29/417* (2006.01)
*H01L 29/49* (2006.01)
*H01L 29/786* (2006.01)

(52) U.S. Cl.
CPC ............ *H01L 27/124* (2013.01); *H01L 29/41* (2013.01); *H01L 29/41733* (2013.01); *H01L 29/4908* (2013.01); *H01L 29/786* (2013.01)

(56) References Cited

U.S. PATENT DOCUMENTS

2013/0240995 A1* 9/2013 Li .................... H01L 29/458
257/368
2014/0342490 A1* 11/2014 Xu et al. ........... H01L 27/14687
438/59

FOREIGN PATENT DOCUMENTS

| CN | 101887893 A | 11/2010 |
|---|---|---|
| CN | 102623461 A | 8/2012 |
| CN | 103715171 A | 4/2014 |
| JP | H07297185 | 11/1995 |
| JP | 2005044936 A | 2/2005 |
| WO | WO2014/015589 | * 1/2014 |
| WO | WO2014/015589 A1 | * 1/2014 |

OTHER PUBLICATIONS

Apr. 6, 2017—(CN) First Office Action Appn 201510158811.9 with English Tran.

* cited by examiner

CONDUCTIVE STRUCTURE AND MANUFACTURING METHOD THEREOF, ARRAY SUBSTRATE, DISPLAY DEVICE

The application is a U.S. National Phase Entry of International Application No. PCT/CN2015/087879 filed on Aug. 24, 2015, designating the United States of America and claiming priority to Chinese Patent Application No. 201510158811.9, filed on Apr. 3, 2015. The present application claims priority to and the benefit of the above-identified applications and the above-identified applications are incorporated by reference herein in their entirety.

TECHNICAL FIELD

Embodiments of the present invention relate to a conductive structure and a manufacturing method thereof, an array substrate, a display device.

BACKGROUND

A low temperature poly-silicon (briefly called as LTPS) thin film transistor display device differs from a traditional amorphous silicon thin film transistor display device in that, its electronic mobility can reach 50 to 200 $cm^2$/vs, and then the channel area can be reduced effectively so as to decrease the area of a thin film transistor device, and to achieve an object of improving the aperture ratio and the degree of integration. As a result, while the brightness of the display is improved, the power consumption can be reduced as well.

In the LTPS process, in order to reduce the line resistance, each signal line is generally made by using metal aluminum (Al) with relatively low cost, relatively high conductivity and very small metal ion diffusion property. However, when a subsequent Hydro (hydrogenating) process is carried on, due to the thermal expansion property of pure aluminum itself, a phenomenon of small protrusion (hillock) on surface is very prone to occur to pure Al with a relatively high thickness in the event that grain directions are relatively consistent. Consequently, the contact situation of signal lines and the follow-up optical inspection work are affected greatly.

SUMMARY

With a conductive structure and a manufacturing method thereof, an array substrate and a display device provided by embodiments of the invention, a hillock phenomenon that happens to a conductive structure on an array substrate when heated can be inhibited.

According to at least an embodiment of the present invention, there is provided a conductive structure, which includes a plurality of first metal layers made of aluminum, and between every two first metal layers that are adjacent, there is also provided a second metal layer, which is made of a metal other than aluminum.

In some examples, densities of two adjacent first metal layers differ.

In some examples, a thickness of each of the second metal layers is in a range of 1 nm to 8 nm.

In some examples, a thickness of each of the first metal layers is in a range of 200 angstroms to 2800 angstroms.

In some examples, a number of the first metal layers included in the conductive structure is 2 to 4.

In some examples, it further includes a third metal layer made of Ti or Mo and a fourth metal layer made of Ti or Mo, and each of the first metal layers and each of the second metal layers are each located between the third metal layer and the fourth metal layer.

In some examples, a material of the second metal layer is any one or more selected from the group consisting of Ag, Cu, MoTa, MoNb and Ti.

According to at least an embodiment of the invention, there is further provided an array substrate, which includes a gate line, a data line, a source electrode, a drain electrode, and a gate electrode, at least one of the gate line, the data line, the source electrode, the drain electrode and the gate electrode being the above conductive structure.

According to at least an embodiment of the invention, there is further provided a display device, which includes the above array substrate.

According to at least an embodiment of the invention, there is further provided a manufacturing method of a conductive structure, which includes fabricating a plurality of first metal layers on a substrate by using aluminum, and fabricating a second metal layer between every two adjacent first metal layers by using other metal than aluminum.

In some examples, before fabricating of the plurality of first metal layers on the substrate by using aluminum, and fabricating of the second metal layer between every two adjacent first metal layers by using other metal than aluminum, it includes fabricating a third metal layer on the substrate by using Ti or Mo; after fabricating of the plurality of first metal layers on the substrate by using aluminum, and fabricating of the second metal layer between every two adjacent first metal layers by using other metal than aluminum, it includes fabricating a fourth metal layer by using Ti or Mo.

BRIEF DESCRIPTION OF THE DRAWINGS

In order to illustrate the technical solution in the embodiments of the invention more clearly, the drawings of the embodiments will be briefly introduced below; it is obvious that the drawings as described below are only related to some embodiments of the invention, but not limitative of the present invention.

DETAILED DESCRIPTION

Figure 1:
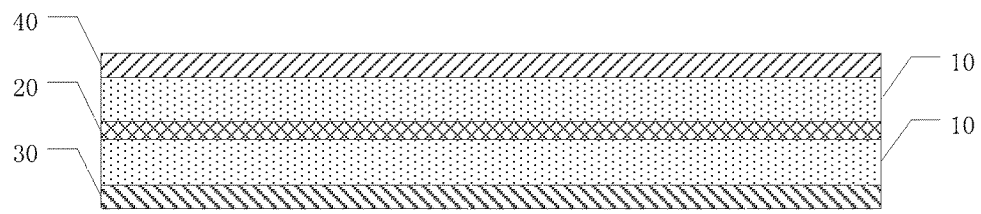
FIG. 1 is a schematic view illustrating a conductive structure provided by an embodiment of the invention.

In order to make objects, technical details and advantages of the embodiments of the invention apparent, hereinafter, the technical solutions in the embodiments of the invention will be described in a clearly and fully understandable way in connection with the drawings in the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

According to at least an embodiment of the present invention, there is provided a conductive structure, which includes a plurality of first metal layers made of aluminum, and between every two first metal layers that are adjacent, there is also provided a second metal layer, which is made of other metal than aluminum.

With respect to the conductive structure provided by at least an embodiment of the invention, by providing a plurality of first metal layers made of aluminum, and providing a second metal layer between every two first metal layers that are adjacent for separation, the continuous length of grains in a single first metal layer can be decreased, and in turn, the hillock phenomenon that happens to the conductive structure when it is heated can be reduced without decreasing the overall thickness of the conductive structure.

Regarding the conductive structure provided by at least an embodiment of the invention, the first metal layer is an aluminum film made by using pure aluminum, and material of the second metal layer may be one or more selected from the group consisting of Ag (silver), Cu (copper), MoTa (an alloy of molybdenum and tantalum), MoNb (an alloy of molybdenum and niobium), and Ti (titanium). For example, if for the sake of enhancing the conductivity of the conductive structure, Ag may be adopted for the second metal layer, and a film layer of Cu, MoTa, MoNb, Ti or the like having better contact with Al may be selected as well; in case that the process convenience is considered, Ti may be adopted for the second metal layer.

In addition, numbers of the first metal layer and the second metal layer may be set according to actual situations; for example, the conductive structure may include 2 to 4 first metal layers (or 1 to 3 second metal layers), and the thickness of each of the first metal layers may be in the range of 200 angstroms to 2800 angstroms. For example, if the conductive structure includes two first metal layers, then the thickness of each of the first metal layers may be in the range of 2000 angstroms to 2800 angstroms, and for example, it may be 2300 angstroms, 2600 angstroms or the like; if the conductive structure includes four first metal layers, then the thickness of each of the first metal layers may be in the range of 200 angstroms to 800 angstroms, and for example, it may be 300 angstroms, 600 angstroms or the like.

In at least an embodiment of the invention, thickness of each of the second metal layers may be in the range of 1 nm to 8 nm, and so, not only adverse effects on the overall conductivity of the conductive structure can be avoided, but also good etching results are obtained in the course of etching it to form a pattern. For example, thickness of the second metal layer may be 3 nm, 5 nm, 7 nm or the like.

In at least an embodiment of the invention, densities of two adjacent first metal layers may be made to differ, and then grains in the first metal layers on two sides of the same second metal layer can be inconsistent. Consequently, the hillock phenomenon that happens to the conductive structure when it is heated can be further inhibited.

In at least an embodiment of the invention, the conductive structure further includes a third metal layer made of Ti or Mo and a fourth metal layer made of Ti or Mo, and each of the first metal layers and each of the second metal layers are each located between the third metal layer and the fourth metal layer. The third metal layer is formed in the lowest part of the conductive structure to serve as a barrier layer, for obstructing aluminum atoms in the first metal layers from diffusing outward. For example, in a low-temperature thin film transistor, a conductive structure (such as a gate electrode or source/drain electrode) is formed over a semiconductor active layer, so that a third metal layer is disposed between a first metal layer and the semiconductor layer of amorphous silicon, and thus, aluminum atoms in the first metal layer can be obstructed from diffusing to the semiconductor active layer; as for the fourth metal layer, it is disposed at the uppermost level of the conductive structure, and due to the fact that the hillock phenomenon is not liable to occur on surface under the condition of high temperature in the case of Mo and Ti, and the hardness of the two is higher than that of Al, the release of stress in the first metal layer can be inhibited, and then, occurrence of hillock on a surface of the first metal layer at the uppermost level can be further inhibited.

Referring to FIG. 1, which is a schematic view illustrating a conductive structure provided by an embodiment of the invention, the conductive structure includes a third metal layer 30 made of Ti or Mo and a fourth metal layer 40 made of Ti or Mo, and between the third metal layer 30 and the fourth metal layer 40, there are provided two first metal layers 10 made of aluminum and a second metal layer 20 located between the two first metal layers 10. Each of the two first metal layers is an aluminum film made by using pure aluminum, and deposition densities of the two first metal layers differ. The second metal layer is a metal thin film made by using Ag, Cu, MoTa, MoNb or Ti, and the two first metal layers and the second metal layer are disposed by way of overlapping with each other, so that the second metal layer is provided between the two first metal layers and is in close contact with the two first metal layers on two sides, respectively. By separating the two first metal layers from each other by the second metal layer, the continuous length of grains in each of the first metal layers can be reduced, and the hillock phenomenon that happens to the conductive structure when it is heated is effectively decreased.

Figure 2:
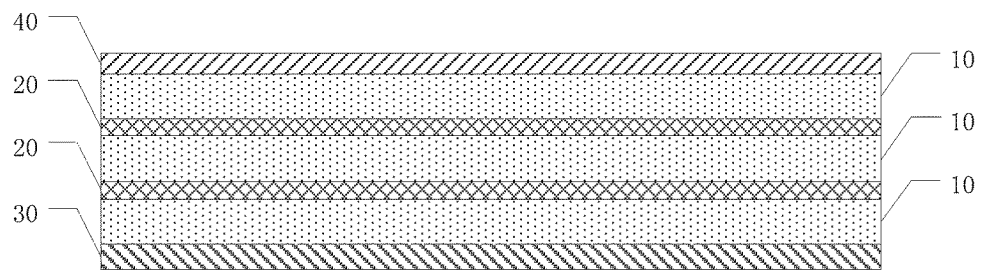
FIG. 2 is a schematic view illustrating a conductive structure provided by another embodiment of the invention.

Referring to FIG. 2, which is a schematic view illustrating a conductive structure provided by another embodiment of the invention, the conductive structure includes a third metal layer 30 made of Ti or Mo and a fourth metal layer 40 made of Ti or Mo, three first metal layers 10 made of pure aluminum are also provided between the third metal layer 30 and the fourth metal layer 40, and a second metal layer 20 is also provided between every two first metal layers 10 that are adjacent. Various layered structures are disposed by way of overlapping, and adjacent layered structures are in close contact. Deposition densities of the three first metal layers differ from one another, and for example, densities of the three first metal layers may be gradually increased in the direction of advancing toward the fourth metal layer from the third metal layer. A metal thin film made by using Ag, Cu, MoTa, MoNb or Ti may be adopted as material of the second metal layer 20. By separating the three first metal layers from each other by two second metal layers, the continuous length of grains in each of the first metal layers can be reduced, and the hillock phenomenon that happens to the conductive structure when it is heated is effectively decreased.

Furthermore, according to at least an embodiment of the invention, there is further provided an array substrate, which includes a gate line, a data line, a source electrode, a drain electrode and a gate electrode, wherein, at least one of the gate line, the data line, the source electrode, the drain electrode and the gate electrode is the aforesaid conductive structure.

Figure 3:
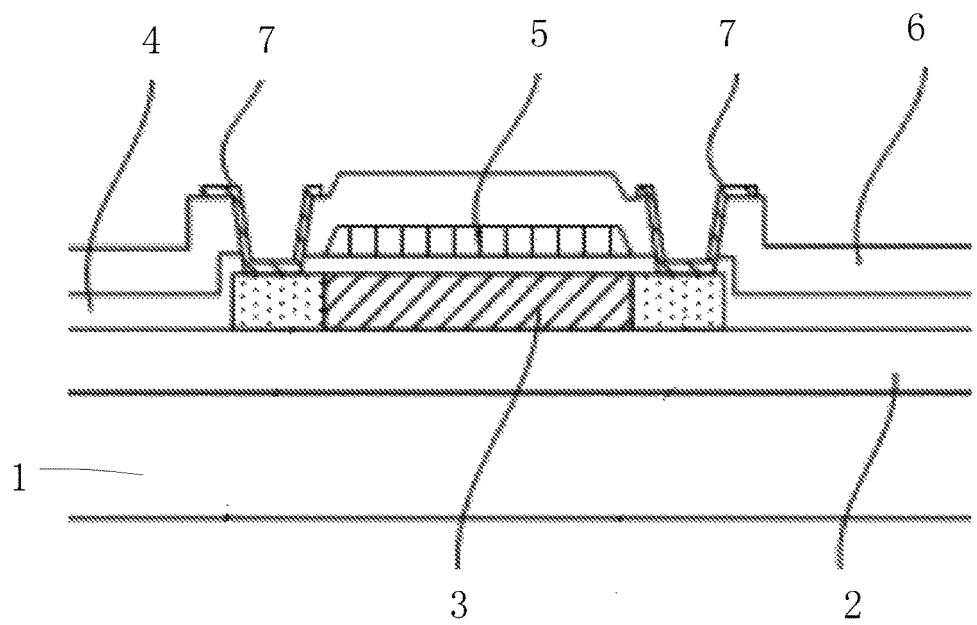
FIG. 3 is a partially schematic view illustrating an array substrate provided by an embodiment of the invention.
Figure 4:
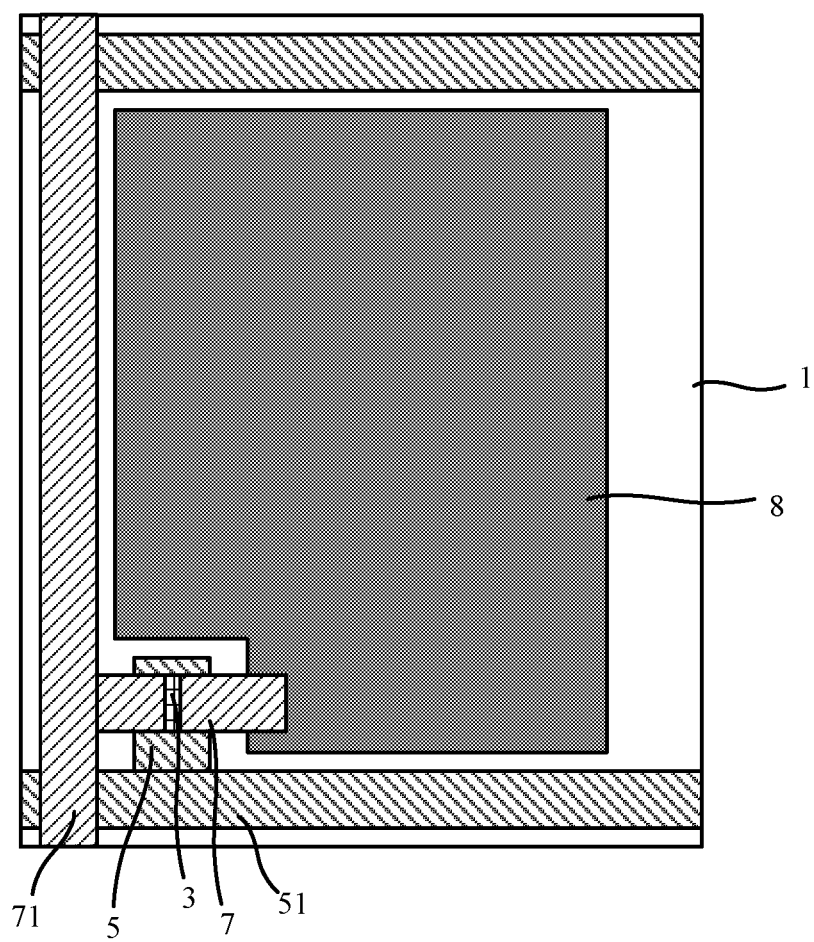
FIG. 4 is a partially, schematically plan view illustrating an array substrate provided by an embodiment of the invention.

Referring to FIG. 3, which is a partially schematic view illustrating an array substrate provided by an embodiment of the invention, the array substrate includes a base substrate 1, and a buffer layer 2, a semiconductor active layer 3, a gate insulating layer 4, a gate electrode 5, an interlayer insulating layer 6 and source/drain electrode 7 that are disposed on the base substrate 1 sequentially. Referring to FIG. 4, it is a partially, schematically plan view illustrating an array substrate provided by an embodiment of the invention. FIG. 4 only illustrates the part in correspondence with one pixel structure, in which, a gate line 51 and a data line 70 that cross with each other are included, wherein, the gate line 51 is connected to the gate electrode 5, and the data line 71 is connected to the source electrode 7. Within a region defined by the gate line and the data line, a pixel electrode 8 is further included, and the pixel electrode is electrically connected to the drain electrode 7 of the thin film transistor.

The gate electrode 5 and source/drain electrode 7 in the array substrate may each adopt the above conductive structure. Taking the source/drain electrode 7 as an example, a third metal layer in it is located in the lowest level of the source/drain electrode so as to contact a substrate, a plurality of first metal layers and second metal layers are formed on a surface of the third metal layer by way of overlapping, and a fourth metal layer is located in the uppermost level to serve as a surface structure of the source/drain electrode. When a hydrogenation process is carried on, owing to the fact that any two first metal layers that are adjacent can be separated from each other by the second metal layer, the continuous length of grains in each of the first metal layers can be reduced, and the hillock phenomenon that happens to the conductive structure when it is heated is effectively decreased. And, with the aid of the third metal layer, aluminum atoms in the first metal layers of the source/drain electrode can be obstructed from diffusing to a semiconductor active layer, so as to prevent them from harmfully affecting the semiconductor active layer. With the aid of the fourth metal layer, the release of stress in the first metal layers when heated can be inhibited, and then, occurrence of hillock on a surface of the source/drain electrode can be further inhibited.

Although descriptions have been given above to an example in which a source/drain electrode 7 is made by the conductive structure according to embodiments of the invention, embodiments according to the invention are not limited thereto, and wherein, at least one of a gate line, a data line, a source electrode, a drain electrode and a gate electrode may be made by the conductive structure according to embodiments of the invention.

With respect to the array substrate provided by at least an embodiment of the invention, by configuring each electrode as well as signal line in the array substrate to be a structure having a plurality of first metal layers made of aluminum, and providing a second metal layer between every two adjacent first metal layers for separation, the hillock phenomenon that happens to the conductive structure when it is heated can be decreased without affecting the resistance of each conductive structure. Moreover, as the main reasons and powers that cause hillock are suppressed, each conductive structure in the array substrate can be increased in thickness from the current 300-400 nm to 1000 nm or even more, and this plays a good role in decreasing resistance of a signal line in the event that the line width of the signal line is relatively small.

Furthermore, according to at least an embodiment of the invention, there is further provided a display device, which includes the aforesaid array substrate. The display device provided by embodiments of the invention may be a display panel of a notebook computer, a liquid crystal display, a liquid crystal television, a digital photo frame, a cell phone, a tablet computer or any other product or component having a display function.

Furthermore, according to at least an embodiment of the invention, there is further provided a manufacturing method of a conductive structure, which includes fabricating a plurality of first metal layers with aluminum on a substrate, and fabricating a second metal layer with other metal than aluminum between every two adjacent first metal layers.

The thickness of each of the second metal layers may be in the range of 1 nm to 8 nm, the thickness of each of the first metal layers may be in the range of 200 angstroms to 2800 angstroms, and material for fabricating the second metal layers may be Ag, Cu, MoTa, MoNb or Ti.

In the above manufacturing method of the conductive structure, the first metal layers of 2 to 4 layers may be formed.

In the above manufacturing method of the conductive structure, densities of two adjacent first metal layers differ.

Before a plurality of first metal layers are fabricated on a substrate by using aluminum, and a second metal layer is fabricated between every two adjacent first metal layers by using other metal than aluminum, the above method further includes fabricating a third metal layer on the substrate by using Ti or Mo.

After a plurality of first metal layers are fabricated on a substrate by using aluminum, and a second metal layer is fabricated between every two adjacent first metal layers by using other metal than aluminum, the above method further includes fabricating a fourth metal layer by using Ti or Mo.

Descriptions made above are merely exemplary embodiments of the invention, but are not used to limit the protection scope of the invention. The protection scope of the invention is determined by the attached claims.

This application claims the benefit of priority from Chinese patent application No. 201510158811.9, filed on Apr. 3, 2015, the disclosure of which is incorporated herein in its entirety by reference as a part of the present application.

The invention claimed is:

1. A conductive structure, comprising at least two first metal layers made of pure aluminum, and a second metal layer made of a metal other than aluminum and provided between every two first metal layers that are adjacent, wherein densities of two adjacent first metal layers differ.

2. The conductive structure according to claim 1, wherein, each of the second metal layers has a thickness in a range of 3 nm to 8 nm.

3. The conductive structure according to claim 1, wherein, each of the first metal layers has a thickness in a range of 200 angstroms to 2800 angstroms.

4. The conductive structure according to claim 1, wherein, a number of the first metal layers included in the conductive structure is 2 to 4.

5. The conductive structure according to claim 1, further comprising a third metal layer made of Ti or Mo and a fourth metal layer made of Ti or Mo, and each of the first metal layers and each of the second metal layers are each located between the third metal layer and the fourth metal layer.

6. The conductive structure according to claim 1, wherein, a material of the second metal layer is any one or more selected from the group consisting of Ag, Cu, MoTa, MoNb and Ti.

7. An array substrate, comprising a gate line, a data line, a source electrode, a drain electrode, and a gate electrode, at least one of the gate line, the data line, the source electrode, the drain electrode and the gate electrode being the conductive structure according to claim 1.

8. A display device, comprising the array substrate according to claim 7.

9. A manufacturing method of a conductive structure, comprising fabricating a plurality of first metal layers on a substrate by using pure aluminum, and fabricating a second metal layer between every two adjacent first metal layers by using a metal than other aluminum, wherein densities of two adjacent first metal layers differ.

10. The manufacturing method of the conductive structure according to claim 9, further comprising fabricating a third metal layer on the substrate by using Ti or Mo before fabricating of the plurality of first metal layers on the substrate by using aluminum, and fabricating of the second metal layer between every two adjacent first metal layers by using the metal other than aluminum; and fabricating a fourth metal layer by using Ti or Mo after fabricating of the plurality of first metal layers on the substrate by using aluminum, and fabricating of the second metal layer between every two adjacent first metal layers by using the metal other than aluminum.

11. The array substrate according to claim 7, wherein, each of the second metal layers has a thickness in a range of 3 nm to 8 nm.

12. The array substrate according to claim 7, wherein, each of the first metal layers has a thickness in a range of 200 angstroms to 2800 angstroms.

13. The array substrate according to claim 7, wherein, a number of the first metal layers included in the conductive structure is 2 to 4.

14. The array substrate according to claim 7, further comprising a third metal layer made of Ti or Mo and a fourth metal layer made of Ti or Mo, and each of the first metal layers and each of the second metal layers are each located between the third metal layer and the fourth metal layer.

* * * * *